United States Patent
Wang (10) Patent No.: US 8,937,811 B2
(45) Date of Patent: Jan. 20, 2015

(54) CHIP CARD HOLDING MECHANISM AND ELECTRONIC DEVICE USING THE SAME

(71) Applicant: Hua-Yong Wang, Shenzhen (CN)

(72) Inventor: Hua-Yong Wang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 238 days.

(21) Appl. No.: 13/676,380

(22) Filed: Nov. 14, 2012

(65) Prior Publication Data
US 2013/0250525 A1    Sep. 26, 2013

(30) Foreign Application Priority Data
Mar. 23, 2012 (CN) .......................... 2012 1 0079126

(51) Int. Cl.
*H05K 7/12* (2006.01)
*H05K 7/14* (2006.01)

(52) U.S. Cl.
CPC ............ *H05K 7/1461* (2013.01); *H05K 7/1402* (2013.01)
USPC ...... 361/737; 361/754; 312/223.1; 312/223.2

(58) Field of Classification Search
CPC ..... G06F 1/1656; G06F 1/1658; G06F 21/32; G06F 13/102; G06F 13/387; G06F 1/1601; G06F 1/1626; G06F 1/1686; G06F 1/203; G06F 21/6209; G06F 2221/2153; G06F 8/60; G06F 9/4415; H05K 5/0286; H05K 7/1461; H05K 5/0091; H05K 5/0239; H05K 5/03; H05K 7/1402; H05K 7/1417; H05K 5/0269
USPC ............... 361/679.01, 679.02, 724–727, 752, 361/679.31–679.39, 747, 741, 740, 736, 361/730, 729, 728, 755, 756, 754, 748, 798, 361/787, 769, 759, 737, 829, 825, 801; 312/223.1–223.2
See application file for complete search history.

(56) References Cited

U.S. PATENT DOCUMENTS 8,605,451 B2 * 12/2013 Tang .............................. 361/754

* cited by examiner

*Primary Examiner* — Jinhee Lee
*Assistant Examiner* — Ingrid Wright
(74) *Attorney, Agent, or Firm* — Novak Druce Connolly Bove + Quigg LLP (57) ABSTRACT

A chip card holding mechanism includes a tray, a supporting plate, an unlocking member, a driving arm, and an elastic member. The unlocking member includes a base body, an unlocking block formed on the base body, and a rotation portion protruding from the base body. The supporting plate defines a first sliding groove, and forms a first block. The driving arm defines a second sliding groove, and forms a second block positioned thereon. The first block is received in the second sliding groove, and the second block is received in the first sliding groove. The elastic member is compressed between the first block and the second block. The rotation of the rotation portion is capable of driving the unlocking block to rotate, thereby releasing the elastic member.

20 Claims, 9 Drawing Sheets

CHIP CARD HOLDING MECHANISM AND ELECTRONIC DEVICE USING THE SAME

BACKGROUND

1. Technical Field

The present disclosure relates to holding mechanisms, and particularly to a chip card holding mechanism and an electronic device using the same.

2. Description of Related Art

Portable electronic devices such as mobile phones and tablet computers may employ at least one chip card (e.g., SIM card) for storing information, connecting to the internet, dialing calls, and the like. It is necessary to provide a chip card holding mechanism for holding/securing the chip card within the portable electronic device. The chip card holding mechanism may define a receiving space, an elastic sheet fitted in the receiving space, and a holding member rotatably assembled on the housing of the portable electronic device. The chip card can be received and held in the receiving space by the holding member, with the chip card resisting the elastic sheet. When detaching or replacing the chip card, a user must detach the outer cover from the portable electronic device first, thereby exposing the chip card holding mechanism; thus, removal and replacement of the chip card is inconvenient. In addition, conventional chip card holding mechanisms have complex structures, and the chip card holding mechanisms may not unlock if the pressure exerted from the pushing done by the user is not sufficient enough to rotate the holding member. On the other hand, excess pressure exerted from the pushing may cause damage to the holding mechanism.

Therefore, there is room for improvement in the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
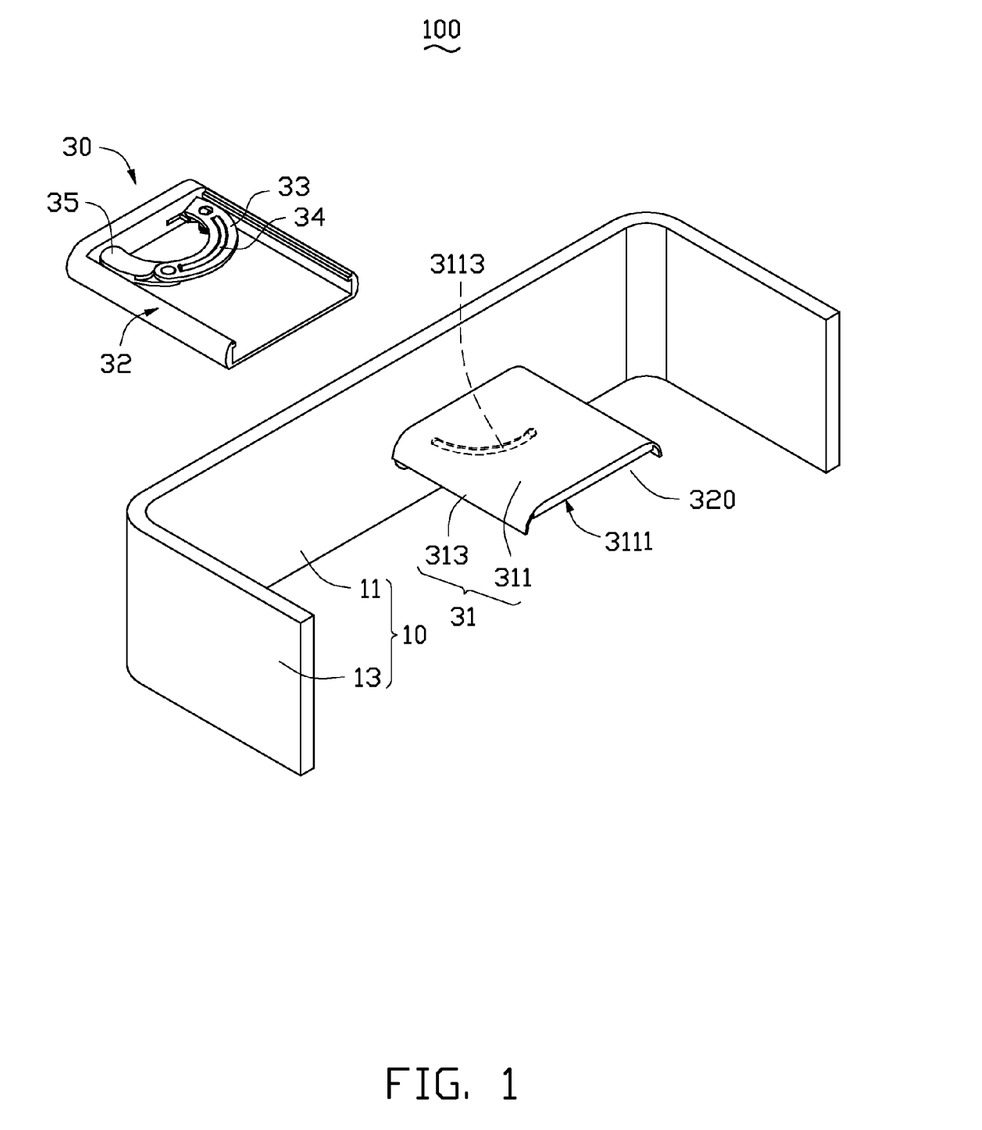
FIG. 1 is a partially explored, isometric view of an embodiment of an electronic device including a chip card holding mechanism including an unlocking member.
Figure 2:
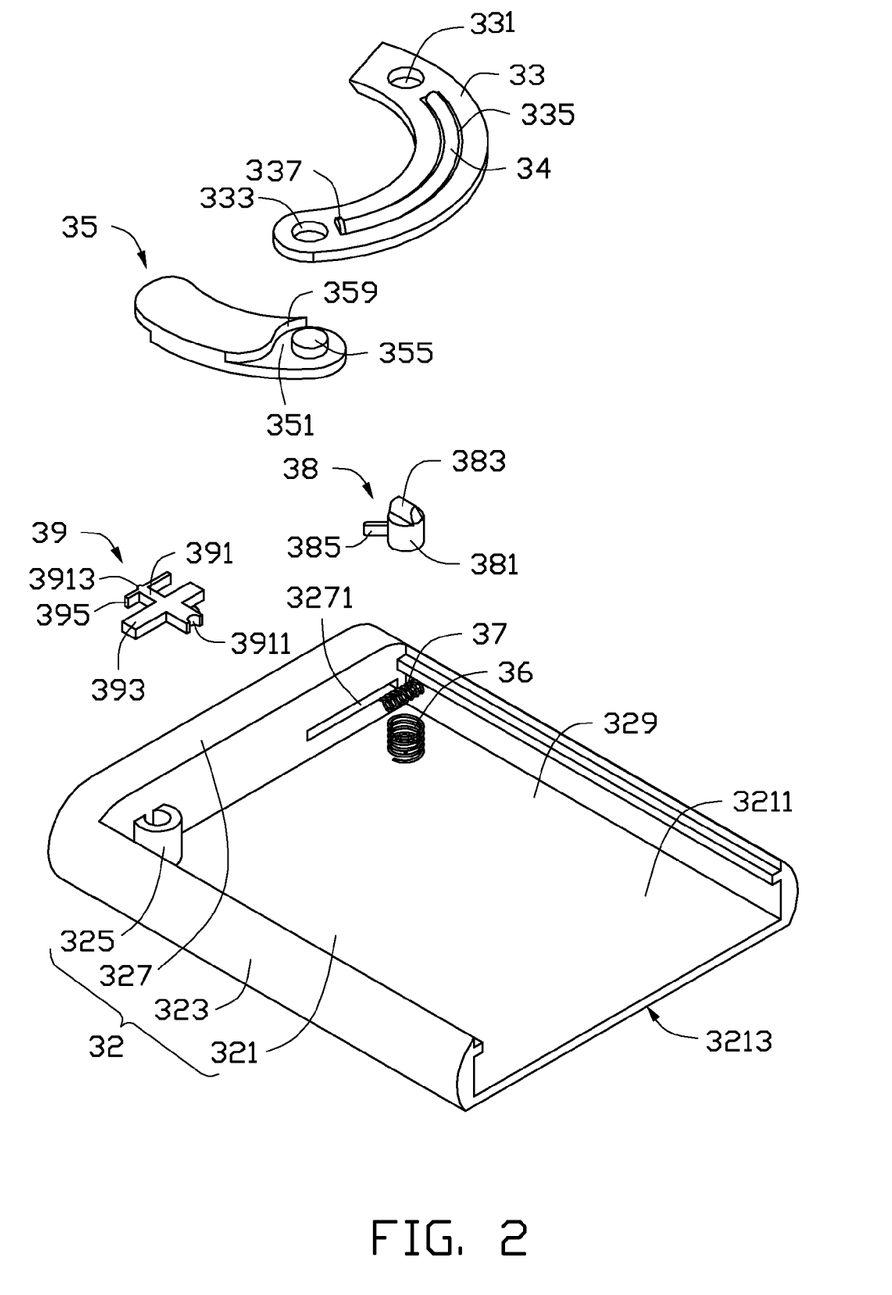
FIG. 2 is a partial, exploded, isometric view of the chip card holding mechanism of the electronic device shown in FIG. 1.

FIGS. 1 and 2 show an embodiment of an electronic device 100 including a partial view of a housing 10, and a chip card holding mechanism 30 engaged with the housing 10. The chip card holding mechanism 30 is configured to hold/secure a chip card within the electronic device 100. The electronic device 100 may be a portable electronic device. In the illustrated embodiment, the chip card holding mechanism 30 is configured to receive and hold a SIM card (not shown), for connecting the SIM card with a connector (not shown) of the electronic device 100, thereby enabling the SIM card to achieve or perform its function. In other embodiments, the chip card holding mechanism 30 may be used to hold other kinds of chip cards, such as SD cards or CF cards, for example.

Figure 3:
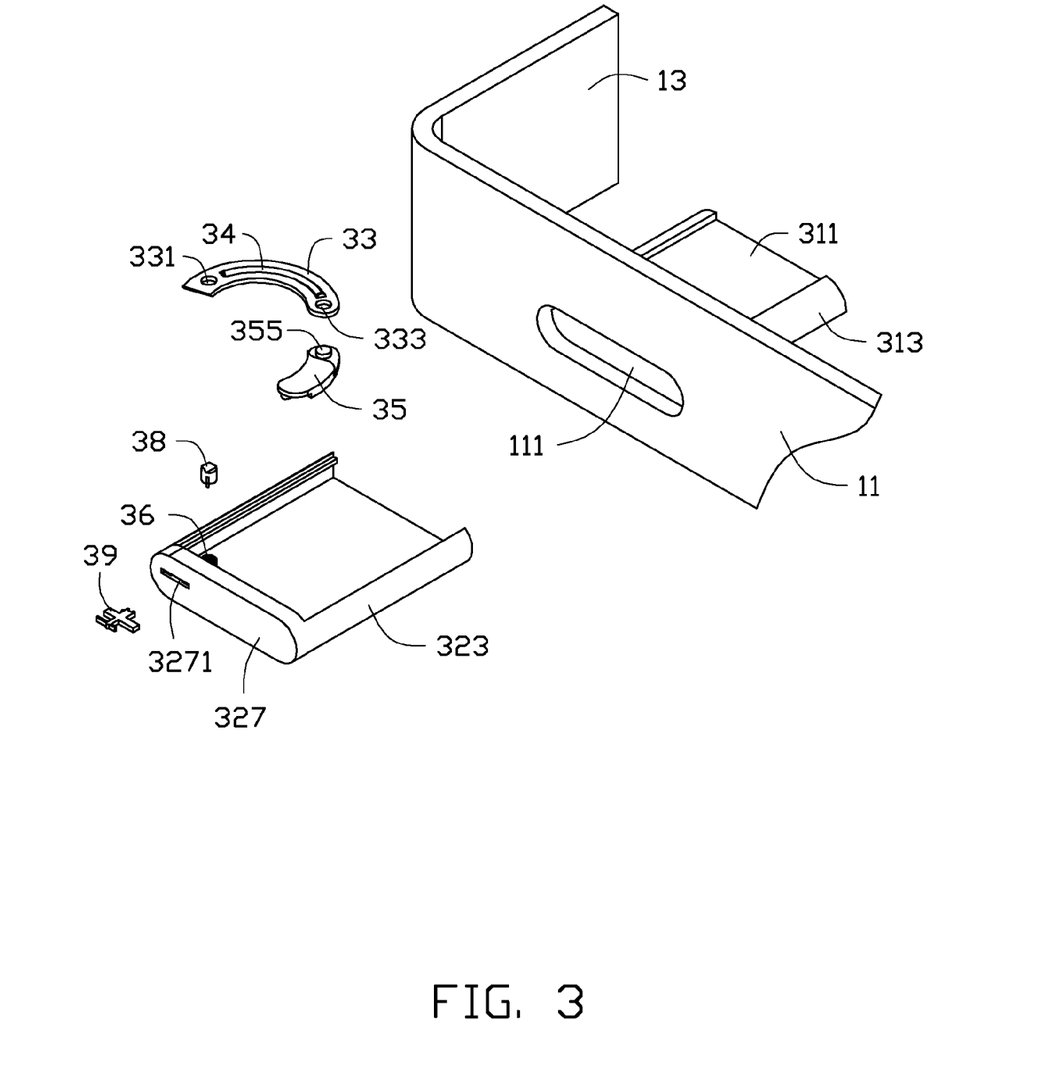
FIG. 3 is an exploded view of the electronic device shown in FIG. 1.

FIG. 3 shows a partial view of the housing 10 including a first sidewall 11 and a pair of second sidewalls 13 perpendicularly extending from the first sidewall 11 parallel to each other. The first sidewall 11 is located adjacent to the chip card holding mechanism 30, and defines an inserting hole 111 (shown in FIG. 3) at a position corresponding to the chip card holding mechanism 30. In the illustrated embodiment, the inserting hole 111 is substantially a slot.

The chip card holding mechanism 30 includes a supporting plate 31, a tray 32, a driving arm 33, a first elastic member 34, a slave arm 35, a second elastic member 36, a third elastic member 37, an unlocking member 38, and a driving member 39. The supporting plate 31 is fixed within the housing 10, and is located adjacent to the inserting hole 111. The tray 32 is slidably inserted into the inserting hole 111, and movably engaged with the supporting plate 31, for receiving and holding a SIM card. The driving arm 33, the first elastic member 34, the slave arm 35, the second elastic member 36, the third elastic member 37, and the unlocking member 38 are sandwiched between the tray 32 and the supporting plate 31. The driving member 39 is configured to rotate the unlocking member 38, thereby releasing a locking force balancing an elastic force of the first elastic member 34, which enables the driving arm 33 to drive the slave arm 35 to move via the elastic force, thus the tray 32 can be pushed out from the inserting hole 111 by the slave arm 35, to install or remove the SIM card.

The supporting plate 31 is substantially a U-shaped plate, which is perpendicularly fixed on an inner surface of the first sidewall 11 beside the inserting hole 111. The supporting plate 31 includes a main body 311, and a pair of first guiding portions 313 extending from two opposite sides of the main body 311. A receiving chamber 320 is cooperatively defined by the main body 311 and the first guiding portions 313. The main body 311 includes a supporting surface 3111 adjacent to the inserting hole 111, for supporting the tray 32. The supporting surface 3111 defines a first sliding groove 3113. In the illustrated embodiment, the first sliding groove 3113 is substantially a quarter-circle, and a cross-section of the first sliding groove 3113 is substantially a semi-circle. The first sliding groove 3113 extends from a substantially middle portion of the main body 311 to an end of the main body 311 near the inserting hole 111. A first block 3115 (shown in FIG. 5) perpendicularly protrudes from a distal end of the first sliding groove 3113 away from the inserting hole 111. In the illustrated embodiment, the first block 3115 is substantially a semi-circular protrusion, and a radius of the first block 3115 is substantially equal to a radius of the cross-section of the first sliding groove 3113.

The tray 32 includes a tray body 321, a pair of second guiding portions 323, a fixing portion 325, and a resisting portion 327. The second guiding portions 323 are bent from two opposite sides of the tray body 321, and are slidably latched with the first guiding portions 313. The resisting portion 327 extends from an end of the tray body 321, and interconnects the pair of second guiding portions 323. The tray body 321 includes a first mounting surface 3211. The fixing portion 325 perpendicularly protrudes from the first mounting surface 3211 of the tray body 321 adjacent to the end of the resisting portion 327, and is located at a corner of the tray body 321. A height of each second guiding portion 323 is substantially equal to a height of the resisting portion 327, and greater than a height of the fixing portion 325. The tray body 321, the second guiding portion 323, and the resisting portion 327 cooperatively define a receiving groove 329, for receiving the driving arm 33, the first elastic member 34, the slave arm 35, the second elastic member 36, the third elastic member 37, and the unlocking member 38.

The tray body 321 further includes a second mounting surface 3213 opposite to the first mounting surface 3211. The first mounting surface 3211 is configured for mounting the second elastic member 36. The second mounting surface 3213 defines a holding groove (not shown), for receiving and holding the SIM card. The pair of second guiding portions 323 have the same shape as the pair of first guiding portions 313, and are slidably latched with the first guiding portions 313. The fixing portion 325 is substantially a hollow cylinder, configured to pivot with the slave arm 35. The resisting portion 327 has the same shape as the inserting hole 111, and defines an opening 3271, to allow the driving member 39 to pass through.

The driving arm 33 is substantially semi-circular, with a radius equal to a radius of the first sliding groove 3113. The driving arm 33 is received in the receiving groove 329. Two ends of the driving arm 33 are pivotable with the unlocking member 38 and the slave arm 35, respectively. The driving arm 33 defines a receiving hole 331 and a pivoting hole 333 at two opposite ends thereof. The receiving hole 331 is adjacent to the unlocking member 38, for engaging with the unlocking member 38. The pivoting hole 333 is adjacent to the slave arm 35, for engaging with the slave arm 35. The driving arm 33 further defines a second sliding groove 335 in a surface away from the tray 32. In the illustrated embodiment, the second sliding groove 335 is substantially semicircular with a radius equal to the radius of the first sliding groove 3113. A cross-section of the second sliding groove 335 is substantially semi-circular, and a radius of the cross-section of the second sliding groove 335 is substantially equal to a radius of the first block 3115. A second block 337 (shown in FIG. 7) perpendicularly protrudes from an end of the driving arm 33 adjacent to the pivoting hole 333. In the illustrated embodiment, the second block 337 is substantially a semi-circular protrusion, and a radius of the second block 337 is substantially equal to a radius of the cross-section of the first sliding groove 3113.

In the illustrated embodiment, the first elastic member 34 is a spring. The first block 3115 is received in the second sliding groove 335, and the second block 337 is received in the first sliding groove 3113. The first elastic member 34 is received in a channel cooperatively defined by the first sliding groove 3113, the second sliding groove 335, the first block 3115, and the second block 337, and is compressed by the first block 3115 and the second block 337.

The slave arm 35 is substantially an arcuate bar, and a radius of curvature of the slave arm 35 is substantially equal to the radius of curvature of the driving arm 33. The slave arm 35 defines a mounting groove 351 at an end thereof adjacent to the driving arm 33. A pivoting member 355 perpendicularly protrudes from a bottom surface of the mounting groove 351. The pivoting member 355 is inserted into the pivoting hole 333, to enable the slave arm 35 to pivot with the driving arm 33. The mounting groove 351 includes an arcuate resisting sidewall 359. An end of the driving arm 33 adjacent to the pivoting member 355 resists against the resisting sidewall 359. Another end of the slave arm 35 away from the pivoting member 355 pivots with the fixing portion 325 of the tray 32. Together the slave arm 35 and the driving arm 33 form a semi-circle.

The second elastic member 36 is mounted on the first mounting surface 3211 of the tray body 321 adjacent to the opening 3271, and located adjacent to an end of the resisting portion 327 away from the fixing portion 325. The unlocking member 38 is mounted on an end of the second elastic member 36 away from the first mounting surface 3211. The unlocking member 38 includes a base body 381, an unlocking block 383, and a rotation portion 385. The base body 381 is substantially cylindrical, and is mounted on the end of the second elastic member 36 away from the first mounting surface 3211. The unlocking block 383 is substantially a quarter of a cylinder and a corner thereof being cut to form a sloping sliding surface 3832 at one end of the unlocking block 383. The unlocking block 383 is located at a side surface of the base body 381 away from the second elastic member 36, and is received at the receiving hole 331. A length of the unlocking block 383 is substantially equal to a diameter of the base body 381, and substantially equal to a diameter of the receiving hole 331.

Figure 4:
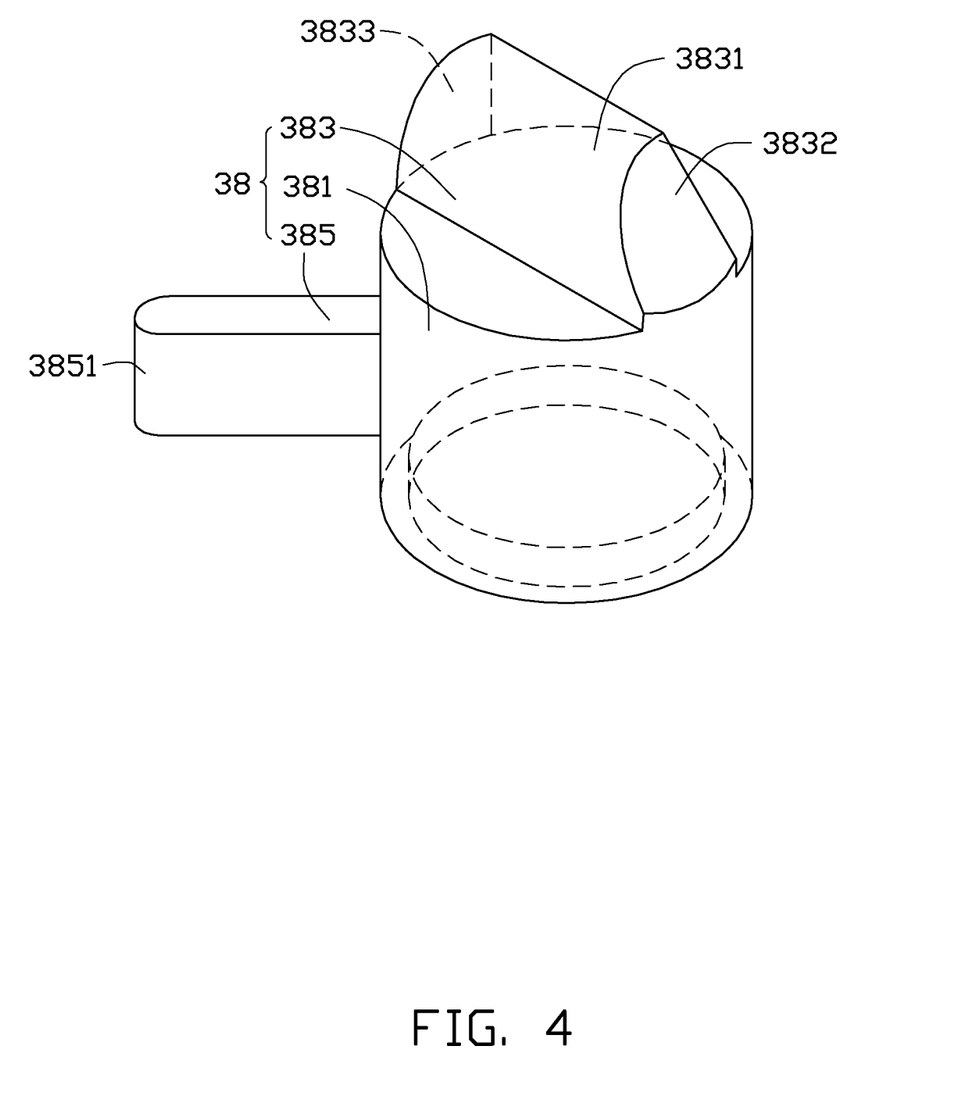
FIG. 4 is an isometric view of the unlocking member shown in FIG. 2.

FIG. 4 shows the unlocking block 383 including an unlocking surface 3831, the sliding surface 3832, and a stopping surface 3833. The unlocking surface 3831 is an arcuate sidewall of the unlocking block 383. The sliding surface 3832 and the stopping surface 3833 are opposite end surfaces of the unlocking block 383. The unlocking surface 3831 connects with the end surface of the base body 381 away from the second elastic member 36. The sliding surface 3832 connects with the unlocking surface 3831. The stopping surface 3833 connects with a cylindrical sidewall of the base body 381. The rotation portion 385 is substantially a rod, and is extended from the cylindrical sidewall of the base body 381 to the opening 3271, and is located adjacent to the unlocking surface 3831 and the stopping surface 3833. The rotation portion 385 includes a latching end 3851 at a distal end thereof away from the base body 381, for latching with the driving member 39.

The third elastic member 37 is perpendicularly fixed at a sidewall of one of the second guiding portions 323 adjacent to the second elastic member 36, and is positioned between the opening 3271 and the second elastic member 36 parallel to the tray body 321. The driving member 39 is narrower than the opening 3271. The driving member 39 is detachably received in the opening 3271 of the tray 32, and is latched with the rotation portion 385, for rotating the unlocking member 38. The driving member 39 includes a rod body 391, a pair of first limiting portions 393, a pair of second limiting portions 395, and a protrusion 397 (shown in FIG. 6). The rod body 391 defines a latching groove 3911 at a distal end adjacent to the unlocking member 38. The latching groove 3911 is substantially semi-circular, and is latched with the latching end 3851. The rod body 391 includes a driving end 3913 at a distal end opposite to the latching groove 3911. The driving end 3913 is exposed from the opening 3271.

The pair of first limiting portions 393 extend out from opposite sides of the rod body 391, respectively. The pair of second limiting portions 395 extend out from opposite sides of the rod body 391, respectively, and parallel to the pair of first limiting portions 393. The first limiting portions 393 are located closer to the unlocking member 38 than are the pair of second limiting portions 395. The protrusion 397 (shown in FIG. 6) is located at a side of the rod body 391 towards the third elastic member 37, and is closer to the unlocking member 38 than are the first limiting portions 393. The protrusion 397 is connected to a distal end of the third elastic member 37, to enable the driving member 39 to be recovered by the third elastic member 37 when the driving member 39 is moved towards the third elastic member 37.

Figure 5:
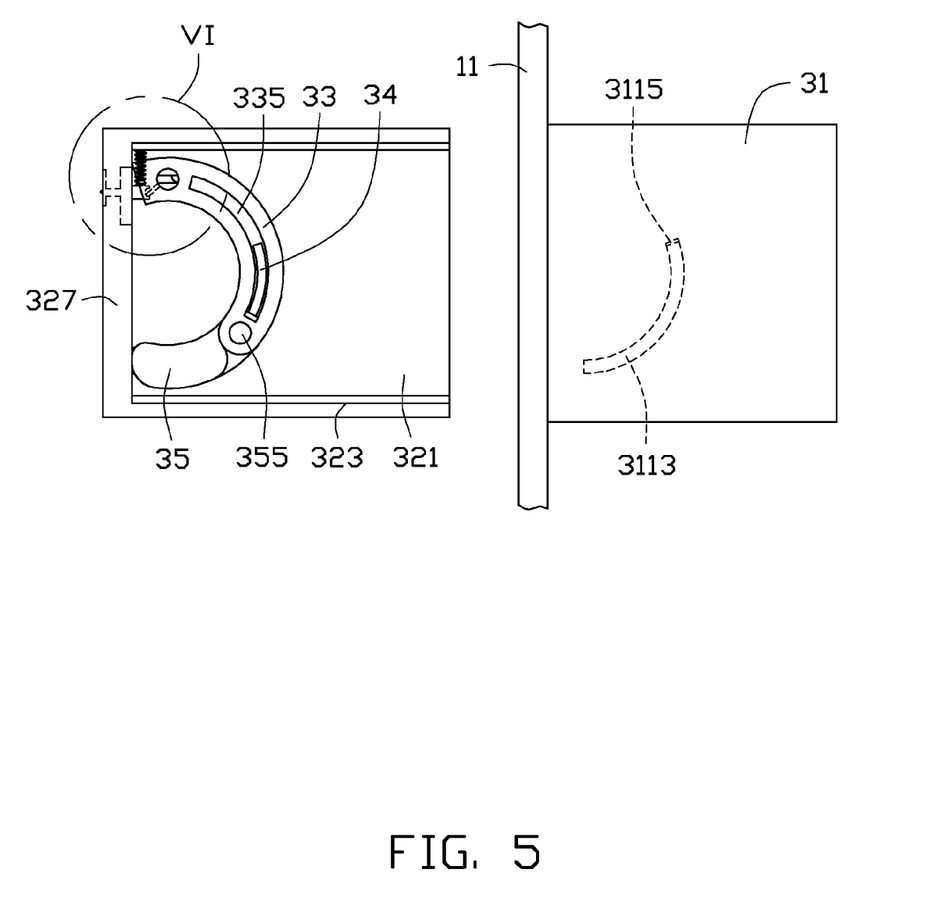
FIG. 5 is a top view of the electronic device shown in FIG. 1.
Figure 6:
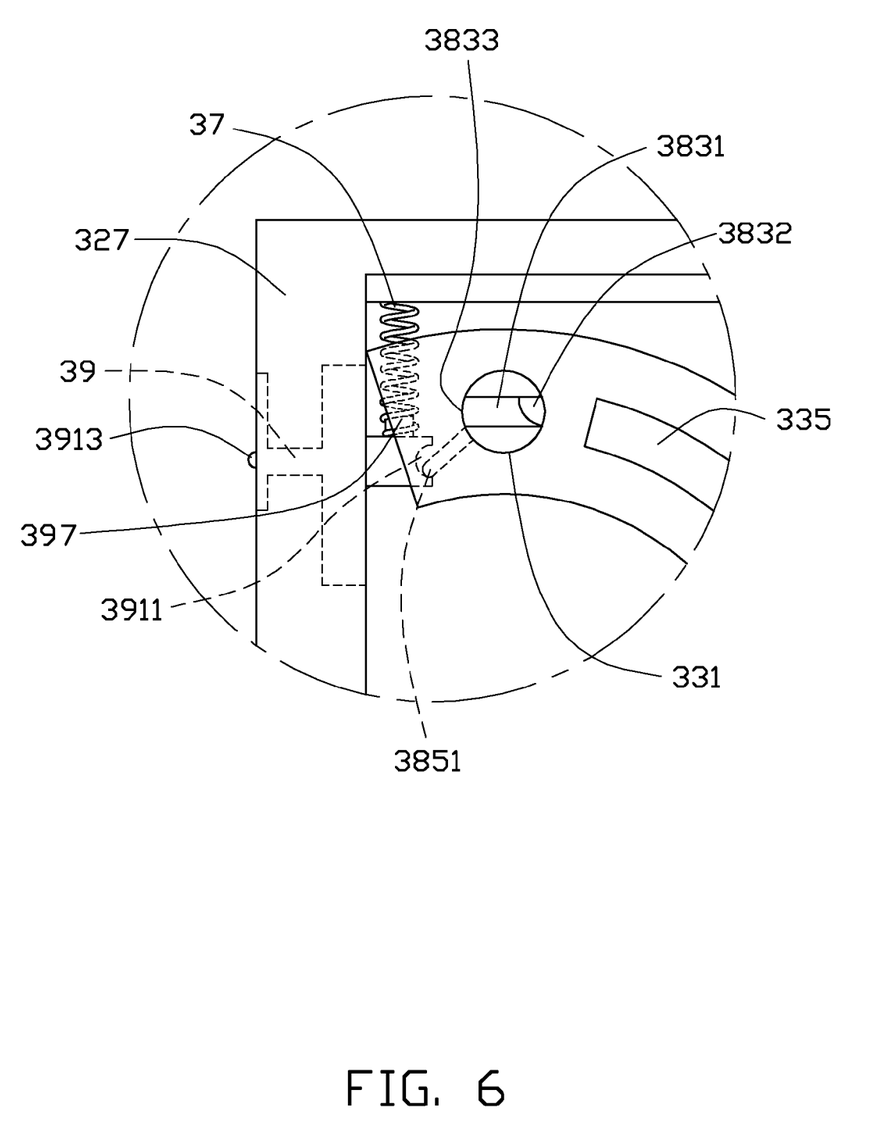
FIG. 6 is an enlarged view of a circled portion VI shown in FIG. 5.
Figure 7:
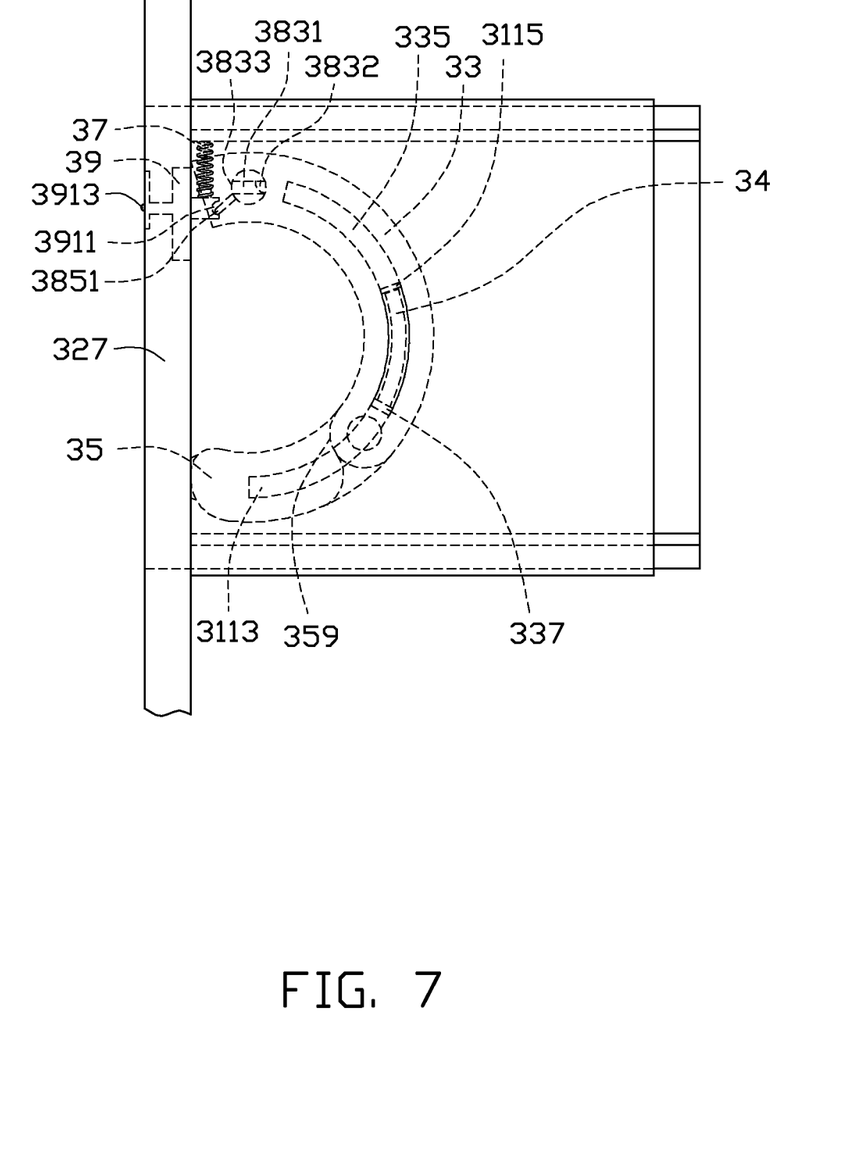
FIG. 7 is top view of a first state of the electronic device shown in FIG. 1.

Referring to FIGS. 5 to 7, in use, first, the second elastic member 36 is mounted on the first mounting surface 3211 of the tray body 321 adjacent to the opening 3271. The third elastic member 37 is fixed at one of the second guiding portions 323, and is parallel to the tray body 321. Second, the unlocking member 38 is fixed at an end of the second elastic member 36 away from the tray body 321, with the stopping surface 3833 facing the opening 3271. The unlocking block 383 is inserted into the receiving hole 331, and the second sliding groove 335 is positioned away from the tray body 321. An arcuate opening of the driving arm 33 is arranged towards the resisting portion 327. The driving member 39 is inserted into the opening 3271, and is received in an end of the opening 3271 adjacent to the fixing portion 325. The latching end 3851 is latched with the latching groove 3911. The driving end 3913 is exposed from the opening 3271. Third, the pivoting member 355 is inserted into the pivoting hole 333, and another end of the slave arm 35 is pivoted with the fixing portion 325. Fourth, the first elastic member 34 is received in an end of the second sliding groove 335 adjacent to the second block 337. The tray 32 is mounted on the supporting plate 31. The first block 3115 is received in the second sliding groove 335, and the second block 337 is received in the first sliding groove 3113. The first elastic member 34 is compressed by the first block 3115 and the second block 337, and is received in the channel cooperatively defined by the first sliding groove 3113, the second sliding groove 335, the first block 3115, and the second block 337. The supporting plate 31 is fixed at the first sidewall 11 beside the inserting hole 111. Because the stopping surface 3833 faces the opening 3271, and resists an inner sidewall of the receiving hole 331 (shown in FIG. 6), a resisting force by the stopping surface 3833 balances the elastic force of the first elastic member 34. Thereby the compressed first elastic member 34 in the channel cannot be released, and the tray 32 is received in the housing 10. The electronic device 100 is arrived at a first state (shown in FIG. 7).

Figure 8:
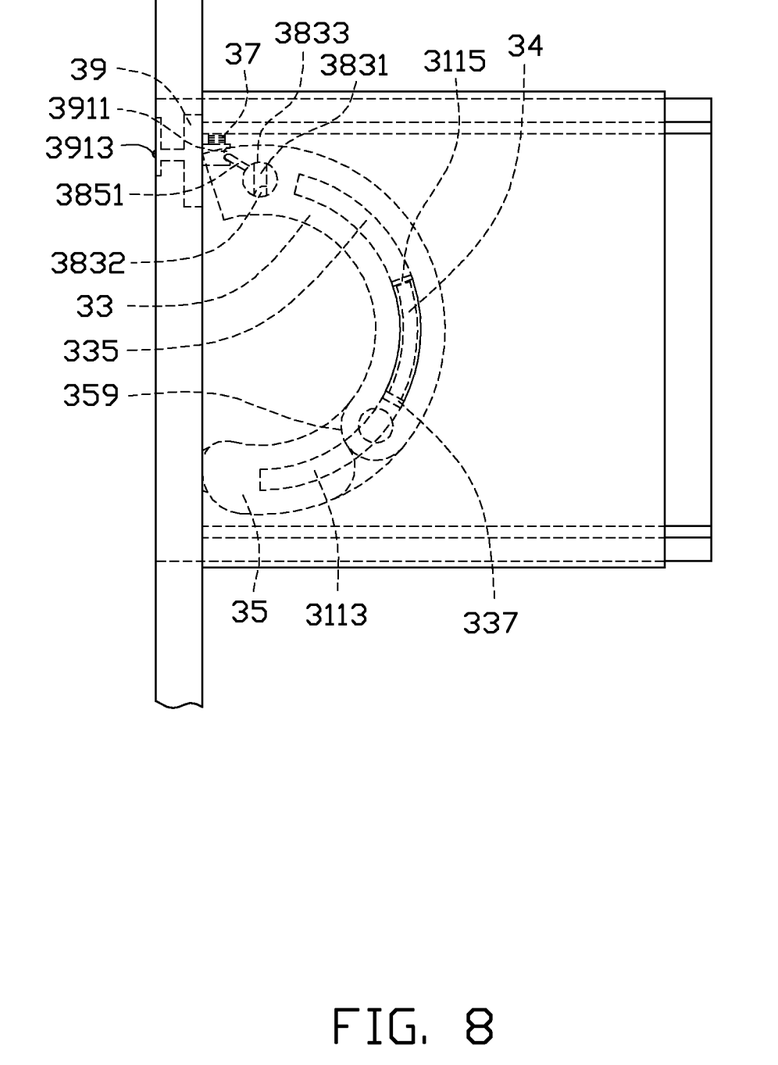
FIG. 8 is similar as FIG. 7, but showing a second state of the electronic device shown in FIG. 1.

Referring to FIG. 8, in use, the driving end 3913 is pushed away from the fixing portion 325, and then the driving member 39 drives the base body 381 and the unlocking block 383 to rotate via the rotation portion 385 until the first limiting portion 393 and the second limiting portion 395 resist an inner sidewall of the opening 3271. In the illustrated embodiment, the base body 381 and the unlocking block 383 are rotated 90 degrees, and then the unlocking surface 3831 faces the opening 3271. The unlocking member 38 unlocks the driving arm 33. The electronic device 100 is arrived at a second state.

Figure 9:
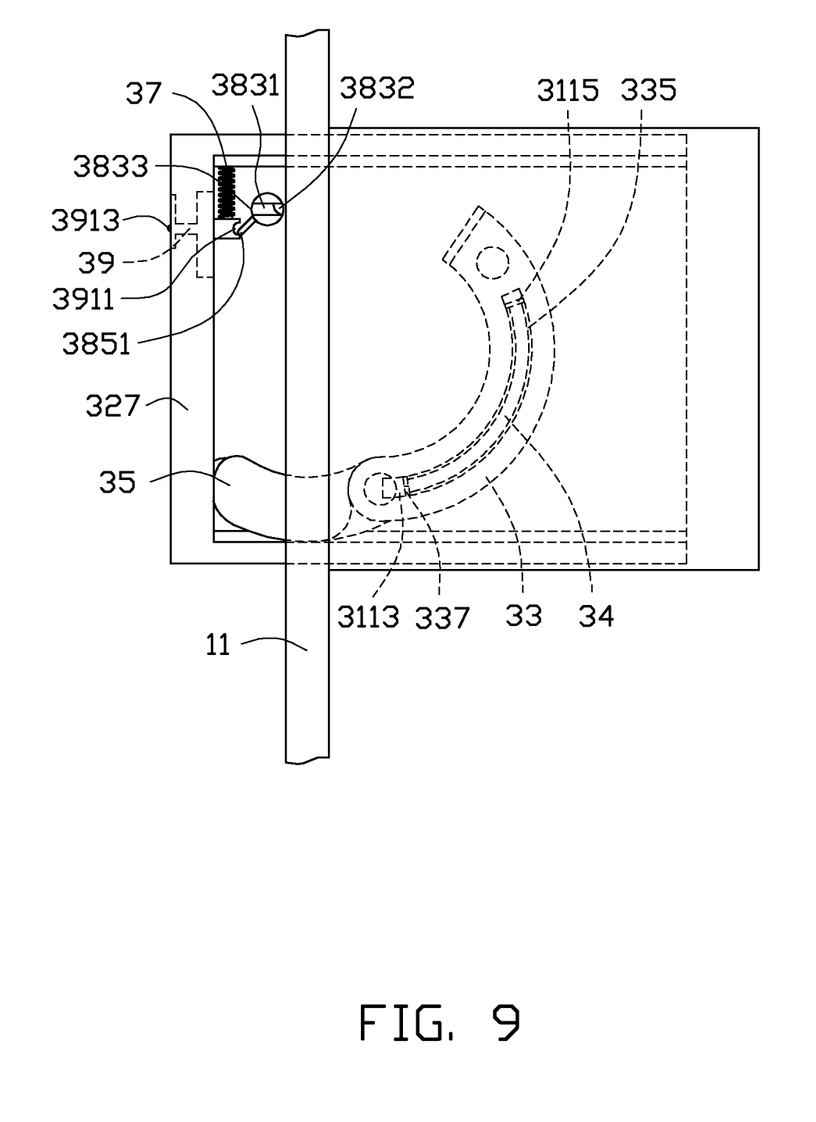
FIG. 9 is similar as FIG. 7, but showing a third state of the electronic device shown in FIG. 1.

Referring to FIG. 9, the stopping surface 3833 is perpendicular to the opening 3271 via rotating 90 degrees, thereby failing to resist the inner sidewall of the receiving hole 331, thus releasing the first elastic member 34, and pushing the second block 337 along the first sliding groove 3113. In addition, because the unlocking surface 3831 faces the opening 3271 after rotating 90 degrees, and the unlocking surface 3831 is an arcuate surface, the driving arm 33 resists the unlocking surface 3831 via the accumulated elastic force of the first elastic member 34, thereby the unlocking block 383 fails to push against the accumulated elastic force and urges the second elastic member 36 to move towards the tray body 321. The unlocking block 383 releases a locking force balancing the accumulated elastic force of the first elastic member 34, therefore the driving arm 33 crosses over the unlocking member 38 via the elastic force of the first elastic member 34. Because the unlocking member 38 unlocks the driving arm 33, the driving arm 33 slides along the first sliding groove 3113. The second block 337 slides along the first sliding groove 3113, and the first block 3115 slides along the second sliding groove 335. The channel in which the first elastic member 34 is received gradually expands. The end of the driving arm 33 adjacent to the slave arm 35 resists the resisting sidewall 359, thus the slave arm 35 rotates relative to the pivoting member 355. The end of the slave arm 35 away from the pivoting member 355 pushes the resisting portion 327 to move outwardly from the inserting hole 111 relative to the supporting plate 31, thereby pushing the tray 32 from the inserting hole 111. The first elastic member 34 releases until the second block 337 resists against an end of the first sliding groove 3113 away from the first block 3115. In the illustrated embodiment, the length of the first elastic member 34 equals a length of the first sliding groove 3113. At the same time, the third elastic member 37 recovers the driving member 39. The electronic device 100 is arrived at a third state. The tray 32 may be further pulled out for insertion and/or removal of the SIM card.

When pushing the resisting portion 327 of the tray 32 toward the inserting hole 111, the driving arm 33 slides along the first sliding groove 3113, thereby compressing the first elastic member 34. Until the driving arm 33 crosses over the unlocking block 383 from the sliding surface 3832, and the unlocking block 383 is received in the receiving hole 331, the stopping surface 3833 resists the inner sidewall of the receiving hole 331 again, for balancing the elastic force of the first elastic member 34. Thus the driving arm 33 is locked, and the tray 32 is received in the housing 10. The electronic device 100 returns to the first state.

In other embodiments, the rotation portion 385 may be designed to pass through the resisting portion 327, thereby directly rotating the rotation portion 385 to rotate the unlocking block 383. The driving member 33 may be designed to a suitable length, to enable an end of the driving member 33 away from the unlocking member 38 to be positioned beside the resisting portion 327, for pushing the resisting portion 327 directly. The first sliding groove 3113 and the second sliding groove 335 may be configured to follow other paths to the inserting hole 111, such as, the first sliding groove 3113 and the second sliding groove 335 can be formed as straight grooves extending towards the inserting hole 111, for example, and the position of the unlocking member 38 may be changed correspondingly. The unlocking surface 3831 can be other shaped surface, such as an inclined surface, for example. The unlocking member 38 may be movably mounted on the tray 32, and the second elastic member 36 may be omitted.

It is believed that the present embodiments and their advantages will be understood from the foregoing description, and it will be apparent that various changes may be made thereto without departing from the spirit and scope of the embodiments or sacrificing all of its material advantages.

What is claimed is:

1. An electronic device, comprising:
 a housing defining an inserting hole; and
 a chip card holding mechanism mounted on the housing, the chip card holding mechanism comprising:
  a supporting plate fixed on the housing besides the inserting hole, and defining a first sliding groove, and a first block protruding from the supporting plate;
  a tray movably inserted into the inserting hole, and movably engaged with the supporting plate;
  an unlocking member comprising a base body, an unlocking block, and a rotation portion, the base body movably mounted on the tray, the unlocking block extended from an end of the base body away from the tray, the rotation portion extended from the base body;

a driving arm pivoted with the unlocking member, and defining a second sliding groove, a second block protruding from the driving arm and being located at an end of the driving arm away from the unlocking member, the first block located at an end of the supporting plate adjacent to the driving arm, the first block received in the second sliding groove, the second block received in the first sliding groove; and a first elastic member compressed between the first block and the second block, wherein when the tray is received in the housing, the unlocking block abuts the driving member to balance an elastic force of the first elastic member, when the rotation portion is rotated, and the unlocking block is rotated via the rotation of the rotation portion, the unlocking block fails to push against the elastic force of the first elastic member, the driving arm sliding along the first sliding groove via the elastic force, to enable to resist the tray to move outwardly from the inserting hole relative to the housing.

2. The electronic device of claim 1, wherein the unlocking block comprises a stopping surface, an unlocking surface, and a sliding surface, the unlocking surface is an arcuate sidewall of the unlocking block, the stopping surface and the sliding surface are opposite end surfaces of the unlocking block, the driving arm defines a receiving hole at an end adjacent to the unlocking member, the unlocking block is received in the receiving hole, the stopping surface resists an inner sidewall of the receiving hole, when the unlocking block is rotated, the stopping surface then fails to resist the inner sidewall.

3. The electronic device of claim 1, wherein the chip card holding mechanism further comprises a slave arm, the tray comprises a tray body, a resisting portion, and a fixing portion, the resisting portion is protruded from an end of the tray body adjacent to the inserting hole, the fixing portion is fixed on the tray body adjacent to the resisting portion, the base body of the unlocking member is mounted on the tray body, two opposite ends of the slave arm are respectively pivoted with the driving arm and the fixing portion, when the driving arm is moving along the first sliding groove, the driving arm pushes the slave arm, to enable the slave arm to push the resisting portion moving outwardly from the inserting hole relative to the housing.

4. The electronic device of claim 3, wherein the slave arm defines a mounting groove at an end adjacent to the driving arm, a pivoting member perpendicularly protrudes from a bottom surface of the mounting groove, the driving arm further defines a pivoting hole at an end away from the receiving hole, the pivoting member is inserted into the pivoting hole, to enable the slave arm to pivot with the driving arm, the mounting groove comprises an arcuate resisting sidewall, and an end of the driving arm adjacent to the pivoting member resisting against the resisting sidewall.

5. The electronic device of claim 3, wherein the supporting plate comprises a pair of first guiding portions at opposite sides thereof, the tray further comprises a pair of second guiding portion protruded from two opposite sides of the tray body, the second guiding portions are slidably latched with the first guiding portions.

6. The electronic device of claim 5, wherein the chip card holding mechanism further comprises a driving member, the resisting portion defines an opening corresponding to the driving member adjacent to the unlocking member, the driving member is movably received in the opening, and is narrower than the opening, the driving member is latched with the rotation portion.

7. The electronic device of claim 6, wherein the chip card holding mechanism further comprises a third elastic member mounted on one of the second guiding portions adjacent to the unlocking member, the third elastic member being parallel to the tray body, the driving member comprises a rod body and a protrusion protruding from a side of the rod body towards the third elastic member, the protrusion is connected to a distal end of the third elastic member.

8. The electronic device of claim 7, wherein the rod body comprises a driving end at a distal end away from the unlocking member, the driving end is exposed from the opening, the rod body defines a latching groove at a distal end adjacent to the unlocking member, the rotation portion comprises a latching end adjacent to the rod body, the latching end is latched with the latching groove.

9. The electronic device of claim 3, wherein the chip card holding mechanism further comprises a second elastic member, the second elastic member is mounted on the tray body adjacent to the resisting portion, and is located opposite to the fixing portion, the base body of the unlocking member is mounted on an end of the second elastic member away from the tray body.

10. A chip card holding mechanism comprising:
a supporting plate defining a first sliding groove, a first block protruding from the supporting plate;
a tray movably engaged with the supporting plate;
an unlocking member comprising a base body, an unlocking block, and a rotation portion, the base body movably mounted on the tray, the unlocking block extended from an end of the base body away from the tray, the rotation portion extended from the base body;
a driving arm pivoted with the unlocking member, and defining a second sliding groove, a second block protruding from the driving arm, and being located at an end of the driving arm away from the unlocking member, the first block located at an end of the supporting plate adjacent to the driving arm, the first block received in the second sliding groove, the second block received in the first sliding groove; and
a first elastic member compressed between the first block and the second block,
wherein the unlocking block abuts the driving member to balance an elastic force of the first elastic member, when the rotation portion is rotated, and the unlocking block is rotated via the rotation of the rotation portion, the unlocking block releasing a locking force balancing the elastic force of the first elastic member, the driving arm sliding along the first sliding groove via the elastic force, to enable to resist the tray to move outwardly relative to the supporting plate.

11. The chip card holding mechanism of claim 10, wherein the unlocking block comprises a stopping surface, a unlocking surface, and a sliding surface, the unlocking surface is an arcuate sidewall of the unlocking block, the stopping surface and the sliding surface are opposite end surfaces of the unlocking block, the driving arm defines a receiving hole at an end adjacent to the unlocking member, the unlocking block is received in the receiving hole, the stopping surface resists an inner sidewall of the receiving hole, when the unlocking block is rotated, the stopping surface fails to resist the inner sidewall.

12. The chip card holding mechanism of claim 10, wherein the chip card holding mechanism further comprises a slave arm, the tray comprises a tray body, a resisting portion, and a fixing portion, the resisting portion is protruded from an end of the tray body, the fixing portion is fixed on the tray body adjacent to the resisting portion, the base body of the unlocking member is mounted on the tray body, two opposite ends of the slave arm are respectively pivoted with the driving arm and the fixing portion, when the driving arm is moving along the first sliding groove, the driving arm pushes the slave arm, to enable the slave arm to push the resisting portion moving outwardly relative to the supporting plate.

13. The chip card holding mechanism of claim 12, wherein the slave arm defines a mounting groove at an end adjacent to the driving arm, a pivoting member perpendicularly protrudes from a bottom surface of the mounting groove, the driving arm further defines a pivoting hole at an end away from the receiving hole, the pivoting member is inserted into the pivoting hole, to enable the slave arm to pivot with the driving arm, the mounting groove comprises an arcuate resisting sidewall, and an end of the driving arm adjacent to the pivoting member resisting to the resisting sidewall.

14. The chip card holding mechanism of claim 12, wherein the supporting plate comprises a pair of first guiding portions at opposite sides thereof, the tray further comprises a pair of second guiding portion protruded from two opposite sides of the tray body, the second guiding portions are slidably latched with the first guiding portions.

15. The chip card holding mechanism of claim 14, wherein the chip card holding mechanism further comprises a driving member, the resisting portion defines an opening corresponding to the driving member adjacent to the unlocking member, the driving member is movably received in the opening, and is narrower than the opening, the driving member is latched with the rotation portion.

16. The chip card holding mechanism of claim 15, wherein the chip card holding mechanism further comprises a third elastic member mounted on one of the second guiding portions adjacent to the unlocking member, the third elastic member being parallel to the tray body, the driving member comprises a rod body and a protrusion protruding from a side of the rod body towards the third elastic member, the protrusion is connected to a distal end of the third elastic member.

17. The chip card holding mechanism of claim 16, wherein the rod body comprises a driving end at a distal end away from the unlocking member, the driving end is exposed from the opening, the rod body defines a latching groove at a distal end adjacent to the unlocking member, the rotation portion comprises a latching end adjacent to the rod body, the latching end is latched with the latching groove.

18. The chip card holding mechanism of claim 12, wherein the chip card holding mechanism further comprises a second elastic member, the second elastic member is mounted on the tray body adjacent to the resisting portion, and is located opposite to the fixing portion, the base body of the unlocking member is mounted on an end of the second elastic member away from the tray body.

19. An electronic device, comprising: a housing defining an inserting hole; and a chip card holding mechanism mounted on the housing, the chip card holding mechanism comprising: a supporting plate fixed on the housing besides the inserting hole, and defining a first sliding groove, the first sliding groove is shaped in a partial circle, a first block protruding from the supporting plate; a tray movably inserted into the inserting hole, and movably engaged with the supporting plate; an unlocking member comprising a base body, an unlocking block, and a rotation portion, the base body movably mounted on the tray, the unlocking block extended from an end of the base body away from the tray, and received in the receiving hole, the unlocking block comprising a stopping surface resisting against an inner sidewall of the receiving hole, the rotation portion extended from the base body; a driving arm defining a second sliding groove at a surface away from the tray, the second sliding groove is a partial circle in shape, and a radius of the second sliding groove equaling to a radius of the first sliding groove, a second block protruding from the driving arm, and located at an end of the driving arm away from the unlocking member, the first block located at an end of the supporting block adjacent to the driving arm, the first block received in the second sliding groove, the second block received in the first sliding groove, the driving arm further defining a receiving hole at an end adjacent to the unlocking member; and a first elastic member compressed between the first block and the second block, wherein when the rotation portion is rotated, and the unlocking block is rotated via the rotation of the rotation portion, the stopping surface fails to resist the inner surface of the receiving hole, the driving arm sliding along the first sliding groove via an elastic force of the first elastic member, to enable to resist the tray to move outwardly from the inserting hole relative to the housing.

20. The electronic device of claim 19, wherein the unlocking block further comprises an unlocking surface and a sliding surface, the unlocking surface is an arcuate sidewall of the unlocking block, the stopping surface and the sliding surface are opposite end surfaces of the unlocking block.

* * * * *